United States Patent
Mao

(10) Patent No.: US 10,121,880 B2
(45) Date of Patent: Nov. 6, 2018

(54) FIN FIELD-EFFECT TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Gang Mao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/398,786

(22) Filed: Jan. 5, 2017

(65) Prior Publication Data
US 2017/0200810 A1    Jul. 13, 2017

(30) Foreign Application Priority Data
Jan. 7, 2016    (CN) .......................... 2016 1 0008863

(51) Int. Cl.
*H01L 21/311*    (2006.01)
*H01L 21/324*    (2006.01)
(Continued)

(52) U.S. Cl.
CPC .. *H01L 29/66795* (2013.01); *H01L 21/31053* (2013.01); *H01L 21/31111* (2013.01);
(Continued)

(58) Field of Classification Search
CPC ......... H01L 21/31053; H01L 21/31111; H01L 21/31144; H01L 21/324; H01L 21/823431;
(Continued)

(56) References Cited

U.S. PATENT DOCUMENTS

| 2006/0138538 | A1* | 6/2006 | Ohmi | H01L 21/28211 |
| | | | | 257/341 |
| 2007/0221965 | A1* | 9/2007 | Miller | H01L 21/2253 |
| | | | | 257/288 |

(Continued)

FOREIGN PATENT DOCUMENTS

CN    104637817 A    5/2015

OTHER PUBLICATIONS

European Patent Office (EPO), The Extended European Search Report for 16207189.8, dated Jun. 21, 2017, 8 Pages.

*Primary Examiner* — Galina Yushina
(74) *Attorney, Agent, or Firm* — Anova Law Group, PLLC

(57) ABSTRACT

The present disclosure provides fin field-effect transistors and fabrication methods thereof. An exemplary fabrication process includes providing a substrate having a first region and a second region; forming first fins in the first region and second fins in the second region; forming a liner oxide layer on side surfaces of the first fins, the second fins and a surface of the substrate; forming an insulating barrier layer on the liner oxide layer in the first region; forming a precursor material layer on the insulating barrier layer in the first region and on the liner oxide layer in the second region; performing a curing annealing process to convert the precursor material into an insulation layer; and removing a top portion of the insulation layer to form an isolating layer and (Continued)

removing portions of the liner oxide layer, the insulating barrier layer, the first oxide layer and the second oxide layer.

18 Claims, 5 Drawing Sheets

(51) Int. Cl.
  *H01L 21/8234* (2006.01)
  *H01L 29/66* (2006.01)
  *H01L 21/3105* (2006.01)
  *H01L 29/06* (2006.01)
  *H01L 29/78* (2006.01)
  *H01L 27/088* (2006.01)

(52) U.S. Cl.
  CPC ...... *H01L 21/31144* (2013.01); *H01L 21/324* (2013.01); *H01L 21/823431* (2013.01); *H01L 27/0886* (2013.01); *H01L 29/0649* (2013.01); *H01L 29/785* (2013.01)

(58) Field of Classification Search
  CPC ......... H01L 29/66785; H01L 29/66795; H01L 27/0886; H01L 29/785
  See application file for complete search history.

(56) References Cited

U.S. PATENT DOCUMENTS

| | | | |
|---|---|---|---|
| 2010/0197096 A1 | 8/2010 | Johnson et al. | |
| 2014/0367795 A1* | 12/2014 | Cai | H01L 27/0886 257/392 |
| 2015/0017781 A1* | 1/2015 | Lin | H01L 21/76224 438/424 |
| 2015/0137263 A1* | 5/2015 | Lee | H01L 29/785 257/401 |
| 2015/0340274 A1* | 11/2015 | Ryan | H01L 21/02271 438/424 |
| 2016/0233088 A1* | 8/2016 | Feng | H01L 21/2256 |

* cited by examiner

FIN FIELD-EFFECT TRANSISTOR AND FABRICATION METHOD THEREOF

CROSS-REFERENCES TO RELATED APPLICATIONS

This application claims the priority of Chinese patent application No. 201610008863.2, filed on Jan. 7, 2016, the entirety of which is incorporated herein by reference.

FIELD OF THE INVENTION

The present invention generally relates to the field of semiconductor manufacturing technology and, more particularly, relates to fin field-effect transistors (FinFETs) and fabrication processes thereof.

BACKGROUND

With the rapid development of semiconductor manufacturing technology, the technical node of the semiconductor technology has been continuously shrunk by following the Moore's Law. To adapt to the reduced technical node, the channel length of the MOSFETs has to be continually reduced. Reducing the channel length of the MOSFETs is able to increase the device density of the integrate circuits (ICs); and increase the switching speed of the MOSFETs, etc.

However, with the continuously shrinking the channel length, the distance between the source and the drain of the device has also be correspondingly reduced. Accordingly, the control ability of the gate on the channel region is reduced; and the difficulty for the gate voltage to pinch off the channel region is increased. Thus, the subthreshold leakage phenomenon may occur. That is, it may be easier to have the short channel effects (SCEs).

Thus, to meet the miniaturization requirements of the semiconductor devices, the semiconductor technology has been gradually developed from the planar MOSFETs to the three-dimensional transistors that have better performances. Fin field-effect transistors (FinFETs) are a typical type of three-dimensional devices.

In a FinFET, the gate is able to control the ultrathin components (i.e., fins) from at least two sides. Thus, comparing with a planar MOSFET, the gate of the FinFET has a stronger control ability on the channel region; and may be able to effectively inhibit the SCEs. Further, comparing with other devices, FinFETs have better compatibilities with the existing IC manufacturing technologies.

However, in the existing technologies, when fins with different critical dimensions (CDs) need to be formed in the FinFET, the fabrication processes may be relatively complex. The disclosed device structures and methods are directed to solve one or more problems set forth above and other problems in the art.

BRIEF SUMMARY OF THE DISCLOSURE

One aspect of the present disclosure includes a method for fabricating a fin field-effect transistor (FinFET). The method includes providing a substrate having a first region and a second region; forming a plurality of first fins on the substrate in the first region and a plurality of second fins on the substrate in the second region; forming a liner oxide layer on side surfaces of the first fins, side surfaces of the second fins and a surface of the substrate; forming an insulating barrier layer on a portion of the liner oxide layer in the first region; forming a precursor material layer on the insulating barrier layer in the first region and on the liner oxide layer in the second region; performing a curing annealing process to convert the precursor material into an insulation layer, a first oxide layer being formed on the side surfaces of the first fins, and a second oxide layer being formed on the side surfaces of the second fins; and removing a top portion of the insulation layer to form an isolating layer and removing portions of the liner oxide layer, the insulating barrier layer, the first oxide layer and the second oxide layer higher than a surface of the isolating layer.

Another aspect of the present disclosure includes a fin field-effect transistor (FinFET). The fin field-effect transistor includes a substrate having a first region and a second region; a plurality of first fins formed on the substrate in the first region and a plurality of second fins with a feature size different from a feature size of the first fins formed on the substrate in the second region; a liner oxide layer formed on the surface of the substrate and bottom portions of side surfaces of the first fins and the second fins; an insulating barrier layer formed on the liner oxide layer in the first region; a first oxide layer formed between the bottom side surfaces of the first fins and the liner oxide layer in the first region and a second oxide layer with a thickness different from a thickness of the first oxide layer formed between the bottom side surfaces of the second fins and the liner oxide layer in the second region; and an isolation layer with a top surface lower than the top surfaces of the first fins and the second fins formed on insulating barrier layer in the first region and on the liner oxide layer in the second region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 9:
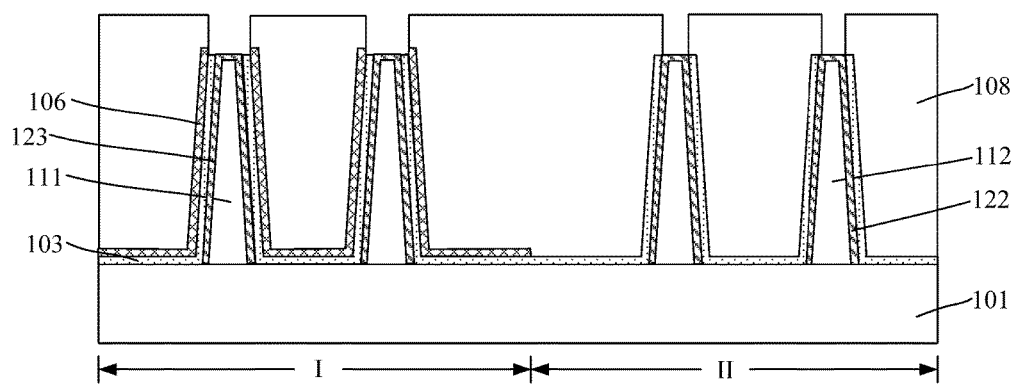
Figure 10:
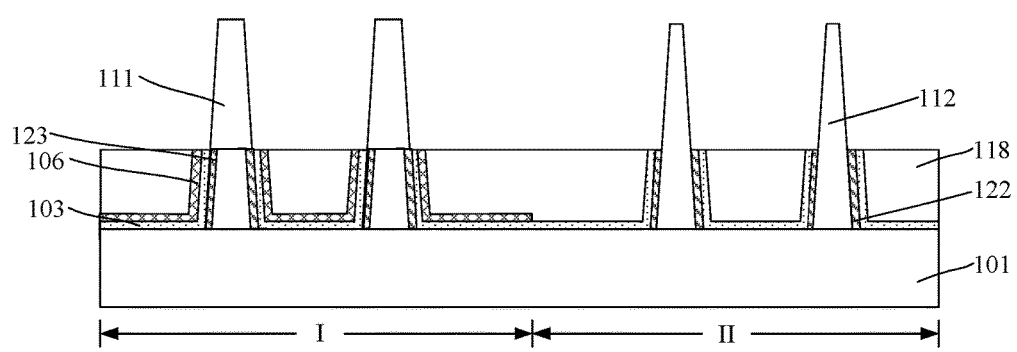
Figure 11:
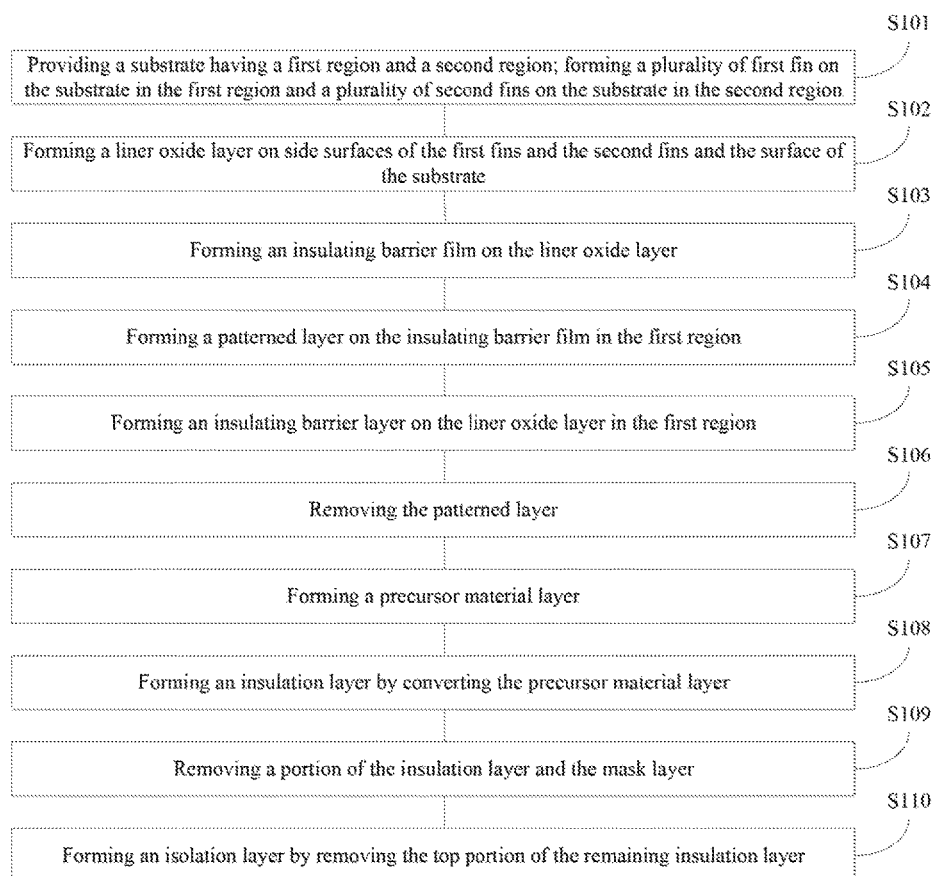
FIG. 11 illustrates an exemplary fabrication process of a FinFET consistent with the disclosed embodiments.

FIG. 11 illustrates an exemplary fabrication process of a FinFET consistent with the disclosed embodiments; and FIGS. 1-10 illustrate semiconductor structures corresponding to certain stages of the exemplary fabrication process.

Figure 1:
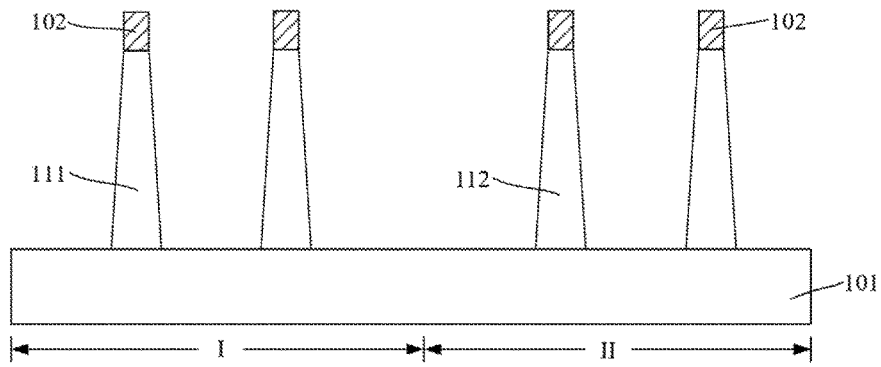
FIGS. 1-10 illustrate semiconductor structures corresponding to certain stages of an exemplary fabrication process of a FinFET consistent with the disclosed embodiments.

As shown in FIG. 11, at the beginning of fabrication process, a substrate with certain structures is provided (S101). FIG. 1 illustrates a corresponding semiconductor structure.

As shown in FIG. 1, a substrate 101 is provided. The substrate 101 may include a first region I and a second region II. A plurality of first fins 111 may be formed on the surface of the substrate 101 in the first region I; and a plurality of second fins 112 may be formed on the surface of the substrate 101 in the second region II. The plurality of first fins 111 and the plurality of second fins 112 may be subsequently processed to cause the plurality of first fins 111 and the plurality of second fins 112 to have different critical dimensions (CDs).

In one embodiment, the first region I is adjacent to the second region II. In certain other embodiments, the first region I and the second region II may be separated by other regions, or structures, etc.

The number of the first fins 111 may be any appropriate value, such as 1, 2, or 5, etc. The number of the second fins 112 may be any appropriate value, such as 1, 2, or 5, etc. In one embodiment, for illustrative purposes, the number of the first fins 111 is 2; and the number of the second fins 112 is 2.

The substrate 101 may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the substrate 101 is made of silicon. The semiconductor substrate 101 provides a base for subsequent structures and processes.

The first fins 111 may be made of any appropriate material, such as silicon, germanium, silicon germanium, gallium arsenide, or gallium indium, etc. The second fins 112 may be made of any appropriate material, such as silicon, germanium, silicon germanium, gallium arsenide, or gallium indium, etc. In one embodiment, the first fins 111 are made of silicon; and the second fins 112 is made of silicon.

The CD of the first fins 111 may be identical to the CD of the second fins 112. The process for forming the first fins 111 and the second fins 112 on the substrate 101 may include providing an initial substrate; forming a hard mask layer 102 on the initial substrate; and etching the initial substrate using the hard mask layer 102 as an etching mask. The initial substrate after the etching process may be referred to as the substrate 101. The protruding parts on the surface of the substrate 101 in the first region I may be referred to as the first fins 111; and the protruding parts on the surface of the substrate 101 in the second region II may be referred to as the second fins 112.

The hard mask layer 102 may be made of any appropriate material, such as one or more of silicon oxide, silicon nitride, silicon oxynitride, and amorphous carbon, etc. The hard mask layer 102 may be a single layer structure or a multiple-layer structure. In one embodiment, the hard mask layer 102 is a single layer structure made of silicon nitride.

The process for forming the hard mask layer 102 may include forming an initial hard mask film; forming a patterned photoresist layer on the initial hard mask film; and etching the initial hard mask film using the patterned photoresist layer as an etching mask. In certain other embodiments, the hard mask layer 102 may be formed by a self-aligned double patterning (SADP) method, a self-aligned triple patterning method, or a self-aligned double double patterning method, etc. The SADP method may include a litho-etch-litho-etch (LELE) method and or a litho-litho-etch (LLE) method.

In one embodiment, after forming the first fins 111 and the second fins 112, the hard mask layer 102 on the top surfaces of the first fins 111 and the second fins 112 may be kept. The hard mask layer 102 may protect the top surfaces of the first fins 111 and the second fins 112; and prevent the top surfaces of the first fins 111 and the second fins 112 from being oxidized. Further during the subsequent planarization process, the top surface of the mask layer 102 may be used as a stop layer; and to protect the tops of the first fins 111 and the second fins 112.

In one embodiment, as shown in FIG. 1, the size of the top of the fins 111 is smaller than the size of the bottom of the fins 111; and the size of the top of the second fins 112 is smaller than the size of the bottom of the second fins 112. In certain other embodiments, the sidewalls of the first fins 111 may be perpendicular to the surface of the substrate 101. That is, the top size of the first fins 111 may be identical to the bottom size of the first fins 111. Further, the sidewall of the second fins 112 may be perpendicular to the surface of the substrate 101. That is, the top size of the second fins 112 may be identical to the bottom size of the second fins 112.

Figure 2:
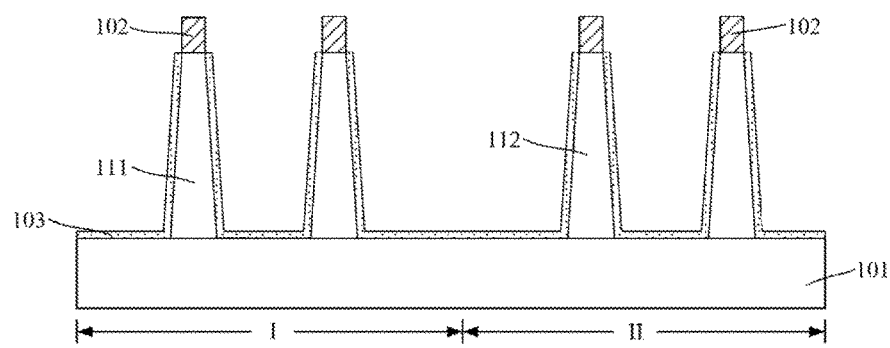

Returning to FIG. 11, after forming the first fins 111 and the second fins 112, a liner oxide layer may be formed (S102). FIG. 2 illustrates a corresponding semiconductor structure.

As shown in FIG. 2, a liner oxide layer 103 is formed on the surface of the substrate 101, the side surfaces of the first fins 111 and the side surfaces of the second fins 112. The liner oxide layer 103 may be formed by any appropriate process. In one embodiment, the liner oxide layer 103 is formed by oxidizing the surface of the substrate 101, the side surfaces of the first fins 111 and the side surfaces of the second fins 112.

Because the top surfaces of the first fins 111 and the top surfaces of the second fins 112 may be covered by the mask layer 102, the top surfaces of the first fins 111 and the top surfaces of the second fins 112 may not be oxidized. Thus, the height of the first fins 111 and the heights of the second fins 112 may not be changed after the oxidation process.

Because the first fins 111 and the second fins 112 may be formed by etching the initial substrate, the surfaces the protruding corners of the first fins 111 and the second fins 112 may have defects. In one embodiment, the first fins 111 and the second fins 112 may be oxidized to form the liner oxide layer 103. During the oxidation process, because the surface-to-volume ratio of the protruding corners of the first fins 111 and the second fins 112 may be relatively large, it may be easier to oxidize the protruding corners of the first fins 111 and the second fins 112 than other regions. Thus, after subsequently removing the liner oxide layer 103, the defects on the surfaces of the first fins 111 and the second fins 112 may be removed; and the protruding corners may also be removed. Accordingly, the surfaces of the first fins 111 and the surfaces of the second fins 112 may be relatively smooth, and the quality of the crystal lattices of the first fins 111 and the second fins 112 may be improved. Therefore, the tip-discharging on the first fins 111 and the second fins 112 may be avoided.

Further, the liner oxide layer 103 may be able to improve the interface properties between subsequently formed insulation layer and the first fins 111 and between the insulation layer and the second fins 112. Thus, the interfacial defects between the insulation layer and the first fins 111 and between the insulation layer and the second fins 112 may be avoided.

The oxidation process may include any appropriate process, such as an oxygen plasma oxidation process, or a solution of sulphuric acid and hydrogen peroxide oxidation process, etc. In one embodiment, an in-situ steam generation (ISSG) oxidation process is used to oxidize the substrate 101, the first fins 111 and the second fins 112 to form the liner oxide layer 103. Because the substrate 101, the first fins 111 and the second fins 112 may all be made of silicon, the corresponding liner oxide layer 103 may be made of silicon oxide.

In one embodiment, the liner oxide layer 103 is made of silicon oxide. The thickness of the liner oxide layer 103 may be in a range of approximately 5 Å-30 Å.

Figure 3:
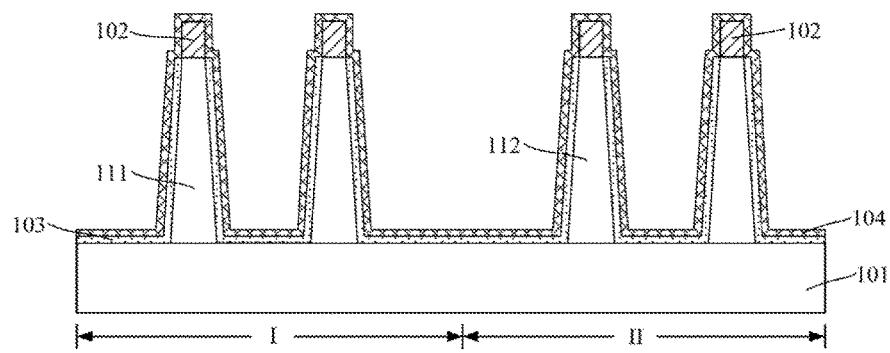

Returning to FIG. 11, after forming the liner oxide layer 103, an insulating barrier film may be formed (S103). FIG. 3 illustrates a corresponding semiconductor structure.

As shown in FIG. 3, an insulating barrier film 104 is formed on the surface of the liner oxide layer 103. A subsequent etching process may remove the portion of the insulating barrier film 104 on the surface of the liner oxide layer 103 in the second region II. The remaining portion of the insulating barrier film 104 on the liner oxide layer 103 in the first region I may be used to reduce the oxidation rate of the sidewalls of the first fins 111 during a subsequent curing annealing process.

Because the portion of the insulating barrier film 104 on the liner oxide layer 103 in the second region II may be subsequently removed by an etching process; and the etching process should not etch the liner oxide layer 103 in the second region II, it may require the insulating barrier film 104 and the liner oxide layer 103 to be made of different materials. Further, the insulating barrier film 104 may be made of a material that is easy to be subsequently removed. At the same time, the insulating barrier film 104 may also be an insulation material. The portion of the insulation film 104 in the first region I may be a portion of the insulation layer of the FinFET; and may function as an electrical insulator.

Thus, the insulating barrier film 104 may be made of silicon nitride, silicon oxynitride, silicon carbide, silicon carbonitride, silicon oxycarbonitride, or boron nitride, etc. In one embodiment, the insulating barrier film 104 is made of silicon nitride. Silicon nitride may have a relatively high compactness. Thus, the insulating barrier film 104 may be able to prevent the diffusion of $H_2O$ during the subsequent curing annealing process; and may be able to effectively reduce the quantity of $H_2O$ contacting with the first fins 111. Thus, the oxidation scale of the sidewalls of the first fins 111 may be reduced.

If the insulating barrier film 104 is substantially thin, the corresponding subsequently formed insulating barrier layer may also be substantially thin, and the ability for preventing the diffusion of $H_2O$ may be limited. If the insulating barrier film 104 is significantly thick, it may take a relatively long time to subsequently remove the portion of the insulating film 104 in the second region II. Further, the insulating barrier layer subsequently formed in the first region I may also be significantly thick. Thus, it may reduce the process window of the subsequently formed precursor material layer; and it may be difficult to form a precursor layer having few voids in the first region I. Thus, the thickness of the insulating barrier film 104 may be in a range of the approximately 30 Å-50 Å. In one embodiment, the thickness of the insulating barrier film 104 is approximately 40 Å.

Various processes may be used to form the insulating barrier film 104, such as a chemical vapor deposition (CVD) process, a physical vapor deposition (PVD) process, or an atomic layer deposition (ALD) process, etc. In one embodiment, the insulating barrier film 104 is formed by an ALD process. The ALD process may have a relatively high step-coverage ability. Thus, the insulating barrier film 104 formed by the ALD process may have a desired uniformity. Accordingly, the diffusion barrier ability of the insulating barrier film 104 at different positions of the insulating barrier film 104 may be identical; and the subsequently oxidized sidewalls of the first fins 111 may still have a desired morphology.

Figure 4:
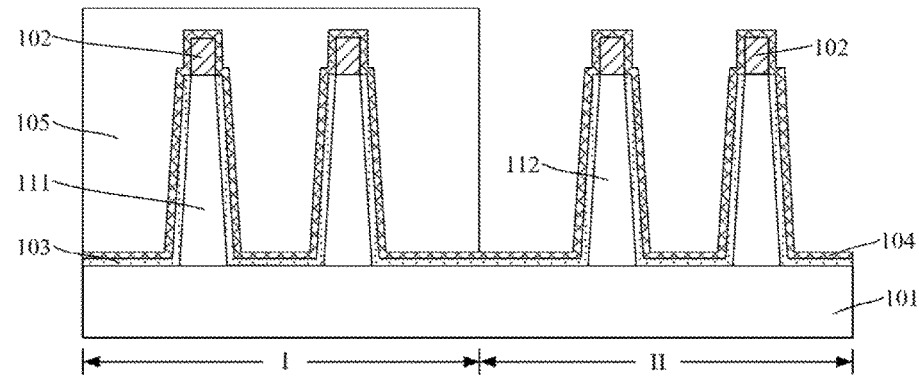

Returning to FIG. 11, after forming the insulating barrier film 104, a patterned layer may be formed (S104). FIG. 4 illustrates a corresponding semiconductor structure.

As shown in FIG. 4, a patterned layer 105 is formed on the surface of the portion of the insulating barrier film 104 in the first region I. The patterned layer 105 may expose the surface of the portion of the insulating barrier film 104 in the second region II. The patterned layer 105 may be used as an mask for subsequently removing the portion of the insulating film 104 the second region II.

The patterned layer 105 may be made of any appropriate material. In one embodiment, the pattered layer 105 is a patterned photoresist layer. The process for forming the patterned photoresist layer 105 may include forming a photoresist layer on the insulating barrier film 104; and exposing the photoresist layer. The top surface of the photoresist layer is higher than the top surface of the hard mask layer 102. After exposing photoresist layer, the exposed photoresist layer may be developed; and the portion of the photoresist layer on the surface of the insulating barrier film 104 in the second region II may be removed.

In certain other embodiments, the patterned layer 105 may also include a bottom antireflective layer; and a photoresist layer formed on the bottom antireflective layer. The patterned layer 105 may also be a hard mask layer. The hard mask layer may be made of a material different from those of the insulating barrier film 104 and the liner oxide layer 103.

Figure 5:
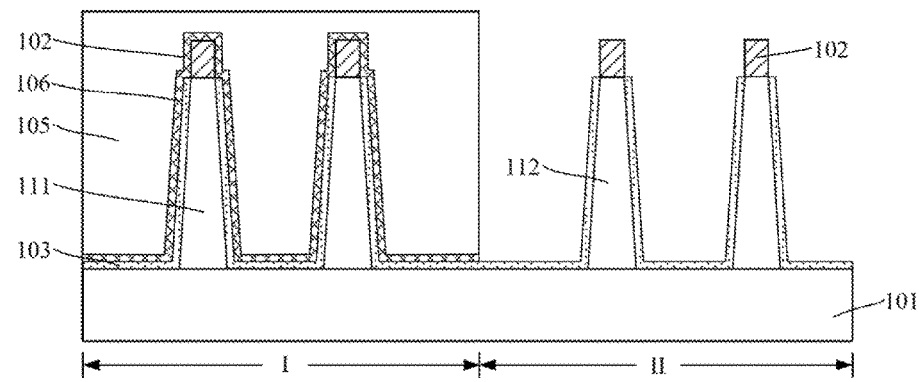

Returning to FIG. 11, after forming the patterned layer 105, an insulating barrier layer may be formed (S105) by removing portion of the insulation film 104 in the second region. FIG. 5 illustrates a corresponding semiconductor structure.

As shown in FIG. 5, an insulating barrier layer 106 is formed on the portion of the liner oxide layer 103 in the first region I. The insulating barrier layer 106 may be formed by removing the insulating barrier film 104 (referring to FIG. 4) in the second region II by an etching process using the patterned layer 105 as an etching mask.

The insulating barrier film 104 may be etched by any appropriate process, such as a dry etching process, or a wet etching process, etc. In one embodiment, a dry etching process is used to etch the insulating barrier film 104. Because the insulating barrier film 104 and the liner oxide layer 103 may be made of different materials, during the dry etching process, the etch rate of the insulating barrier film 104 may be greater than the etching rate of the liner oxide layer 103.

In one embodiment, the insulating barrier layer 106 is made of silicon nitride. Because silicon nitride may has a relatively high compactness, it may prevent the diffusion of $H_2O$ during the subsequent curing annealing process; and may be able to effectively reduce the quantity of $H_2O$ contacting with the side walls of the first fins 111. Accordingly the oxidation rate of the sidewalls of the first fins 111 may be reduced.

If the insulating barrier layer 106 is substantially thin, the ability for preventing the diffusion of $H_2O$ may be limited. The quantity of $H_2O$ contacting with the first fins 111 may be relatively large; and the oxidation scale of the sidewalls of the first fins 111 may be relatively large. Thus, during the subsequent curing annealing process, the feature size differences between the first fins 111 and the second fins 112 may be relatively small. If the insulating barrier layer 106 is significantly thick, the process window for subsequently forming a precursor material layer may be relatively small; and voids may be formed in the precursor material layer in the first region I. Thus, the thickness of the insulating barrier layer 106 may be in a range of the approximately 30 Å-50 Å. In one embodiment, the thickness of the insulating barrier layer 106 is approximately 40 Å. Such a thickness range may enable the insulating barrier layer 106 to have a relatively strong ability to prevent the diffusion of $H_2O$. Further, it may ensure the precursor material subsequently formed in the first region I to have a relatively high gap filling ability.

Figure 6:
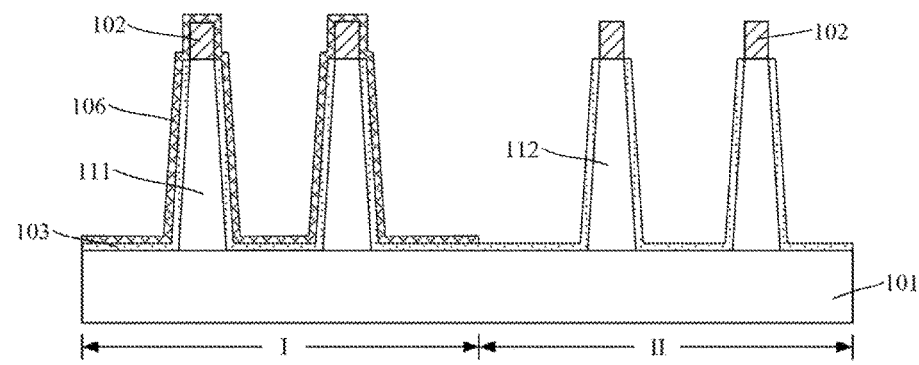

Returning to FIG. 11, after forming the insulating barrier layer 106, the patterned layer 105 may be removed (S106). FIG. 6 illustrates a corresponding semiconductor structure.

As shown in FIG. 6, the patterned layer 105 is removed. In one embodiment, the patterned layer 105 is made of photoresist, a plasma ashing process, or a wet etching process may be used to remove the patterned layer 105. In certain other embodiments, the patterned layer 105 may be a hard mask layer, a dry etching process, or a wet etching process may be used to remove the patterned layer 105.

Figure 7:
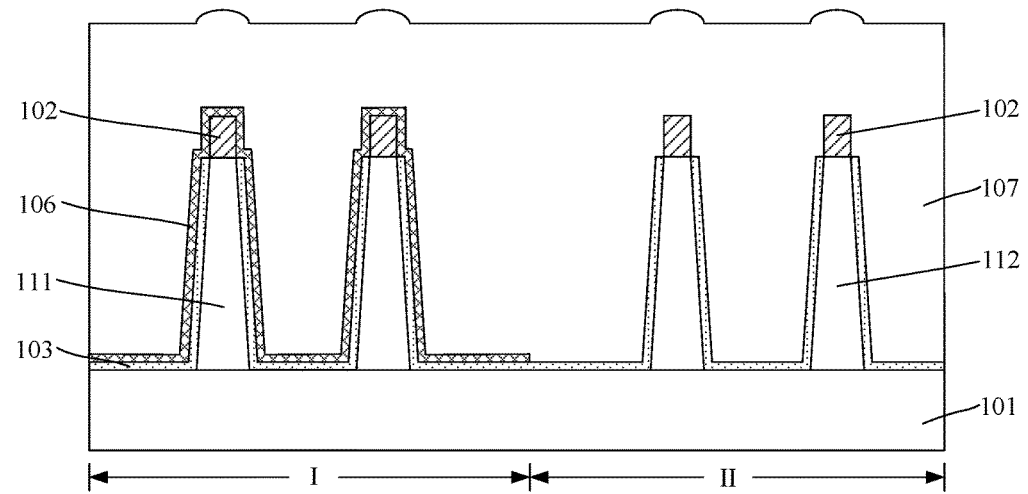

Returning to FIG. 11, after removing the patterned layer 105, a precursor material layer may be formed (S107). FIG. 7 illustrates a corresponding semiconductor structure.

As shown in FIG. 7, a precursor material layer 107 is formed on the surface of the insulating barrier layer 106 in the first region I and the surface of the liner oxide layer 103 in the second region II. The precursor material layer 107 may be flowable. The top of the precursor material layer 107 may be higher than the tops of the first fins 111 and the tops of the second fins 112. The precursor material layer 107 may be used to subsequently form an insulation layer among the first fins 111 and the second fins 112.

With the continuous shrinking of the size of the semiconductor devices, the distances between adjacent first fins 111 and the distances between adjacent second fins 112 have become smaller and smaller. To improve the gap filling ability of the subsequently formed insulation layer, the flowable material may be used to form the precursor material layer 107 on the surface of the insulating barrier layer 106 in the first region I and the surface of the liner oxide layer 103 in the second region II. Because the precursor material layer 107 may be flowable with a certain degree of the viscosity. Thus, a void-less filling may be achieved between adjacent first fins 111, between adjacent second fins 112 and between the first fins 111 and the adjacent second fins 112.

Various processes may be used to form the precursor material layer 107. In one embodiment, the precursor material layer 107 is formed by a flowable-CVD (FCVD) process. During the FCVD process, the substrate 101 may be kept at a pre-determined temperature range, the reaction precursors of the FCVD process may be able to flow into the gaps among the first fins 111, the gaps among the second fins 112 and the gaps among the first fins 111 and the second fins 112. Thus, the flowable precursor material layer 107 may be formed; and the top of the precursor material layer 107 may be higher than the hard mask layer 102.

The reaction precursor of the FCVD process may include one or more of saline, disaline, methylsaline, dimethylsaline, trimethylsaline, tetramethylsaline, tetraethyl orthosilicate, (3-Aminopropyl) triethoxysilane, octamethyl cyclotetrasiloxane, 1,1,3,3-tetramethyldisiloxane, tetramethylcyclotetrasiloxane, trisilylamine, and disilylamine, etc. The reaction precursors may also be other silylamine and their derivatives, etc.

In one embodiment, trimethylsaline is used as the reaction precursor of the FCVD process to form the precursor material layer 107. The FCVD process may be performed in a $NH_3$ environment.

Specifically, the substrate 101 with the formed structures may be placed in a reaction chamber; and the reaction precursor and $NH_3$ may be introduced into the reaction chamber to perform the FCVD process. The flow rate of the reaction precursor may be in a range of approximately 100 sccm-3000 sccm. The flow rate of $NH_3$ may be in a range of approximately 20 sccm-1000 sccm. The pressure of the reaction chamber may be in a range of approximately 0.1 Torr-10 Torr. The temperature of the reaction chamber may be in a range of approximately 20° C.-150° C. Inert gas, such as Ar, He, or Xe, etc., may be also be introduced into the reaction chamber. The flow rate of the inert gas may be in a range of approximately 1000 sccm-10000 sccm.

The reaction precursor of the FCVD process may include Si element. Further, the FCVD process may be performed in an N-containing environment. Thus, the precursor material layer 107 may include at least N atoms and Si atoms. Further, the precursor material layer 107 may also include H atoms. Specifically, the formed precursor material layer 107 may have Si—H bonds, Si—N bonds and Si—N—H bonds, etc. During the subsequent curing annealing process, N atoms in such chemical bonds may be substituted by O atoms; and O—Si—O, and Si—O bonds, etc., may be formed. Thus, an insulation layer made of $SiO_2$ may be formed.

Figure 8:
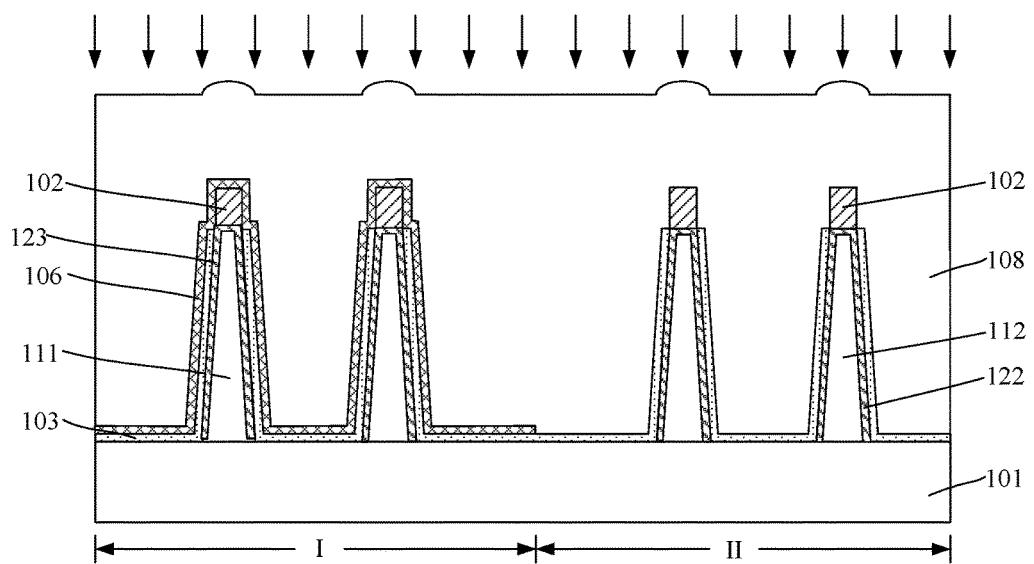

Returning to FIG. 11, after forming the precursor material layer 107, an insulation layer may be formed (S108). FIG. 8 illustrates a corresponding semiconductor structure.

As shown FIG. 8, an insulation layer 108 is formed. The insulation layer 108 may be formed by converting the precursor material layer 107 using a curing annealing process (not labeled).

In one embodiment, the curing annealing process may be performed in an $H_2O$-containing environment. In the $H_2O$-containing environment, the chemical bonds in the precursor material layer 107 may be broken, and/or rearranged, to form new chemical bonds and/or function groups. The O ions in $H_2O$ may diffuse into the precursor material layer 107, and the broken Si bonds, N bonds and H bonds may combine with the O ions to form new chemical bonds, such as Si—O—H bonds, Si—O bonds and O—Si—O bonds, etc. Thus, the precursor material layer 107 may be converted into the insulation layer 108; and the insulation layer 108 may be made of silicon oxide. The top of the insulation layer 108 may be higher than the top of the mask layer 102.

The environment of the curing annealing process may also include one or more of $O_2$ gas and $O_3$ gas, etc. The temperature of the curing annealing process may be in a range of approximately 400° C.-500° C.

In the $H_2O$-containing environment, $H_2O$ may diffuse into the precursor material layer 107. In the first region I, $H_2O$ may diffuse into the side surfaces of the first fins 111 through the liner oxide layer 103 and the insulating barrier layer 106 to form a first oxide layer 123. In the second region II, $H_2O$ may diffuse into the side surfaces of the second fins 112 through the liner oxide layer 103; and the side surfaces of the second fins 112 may be oxidized to form a second oxide layer 122.

Because the insulating barrier layer 106 in the first region I may prevent the diffusion of $H_2O$, the oxidation scale of the side surfaces of the first fins 111 may be lower than the oxidation scale of the side surfaces of the second fins 122. Thus, the thickness of the first oxide layer may be smaller than the thickness of the second oxide layer 122. Because the feature size of the first fins 111 may be identical to the feature size of the second fins 112 before forming the first oxide layer and the second oxide layer 122, after forming the first oxide layer and the second oxide layer 122, the feature size of the first fins 111 may be greater than the feature size of the second fins 122.

In one embodiment, the thickness of the first oxide layer may be approximately 0; and the thickness of the second oxide layer 122 may be in a range of approximately 3 nm-5 nm. In certain other embodiments, the thickness of the first oxide layer may be greater than 0.

In one embodiment, the thickness difference between the first oxide layer and the second oxide layer 122 may be in a range of approximately 3 nm-5 nm. That is, after forming the first oxide layer and the second oxide layer 122, the feature size difference between the first fins 111 and the second fins 112 may be in a range of approximately 3 nm-5 nm. The feature size is the HWHM (half width at half maximum) of the fin above the isolation layer. In certain other embodiments, when the thickness of the insulating barrier layer 106 and/or the parameters of the curing annealing process are changed, the thickness difference between the first oxide layer and the second oxide layer 122 may also be changed.

In one embodiment, after the curing annealing process in the $H_2O$-containing environment, a second annealing process may be performed on the precursor material layer 107 to further strength the conversion of the precursor material layer to the insulation layer 108. The second annealing process may be performed in a $N_2$ environment. The temperature of the second annealing process may be in a range of approximately 900° C.-1100° C. For example, the annealing temperature may be in a range of approximately 900° C.-1000° C.

Returning to FIG. 11, after forming the insulation layer 108, a portion of the insulation layer 108 and the mask layer 102 may be removed (S109). FIG. 9 illustrates a corresponding semiconductor structure.

As shown in FIG. 9, a portion of the insulation layer 108 higher than the mask layer 102 (referring to FIG. 8) is removed. Further, the mask layer 102 is removed The portion of the insulation layer 108 higher than the mask layer 102 may be removed by any appropriate process. In one embodiment, a chemical mechanical polishing process is used to remove the portion of the insulation layer 108 higher than the mask layer 102. The chemical mechanical polishing process may be stopped on the top surface of the mask layer 102. Thus, the mask layer 102 may be used to protect the top surfaces of the first fins 111 and the second fins 112; and the damages caused by the chemical mechanical polishing process may be avoided.

After removing the portion of the insulation layer 108 higher than the mask layer 102, the hard mask layer 102 may be removed. Various processes may be used to remove the hard mask layer 102, such as a dry etching process, or a wet etching process, etc. In one embodiment, a wet etching process is used to remove the hard mask layer 102.

In one embodiment, the hard mask layer 102 is made of silicon nitride. The etching solution of the wet etching process may be a phosphoric acid solution. The mass percentage of the phosphoric acid may be in a range of approximately 65%-85%. The temperature of the etching solution may be in a range of approximately 120° C.-200° C. During the process for removing the hard mask layer 102, the insulating barrier layer 106 on the mask layer 102 in the first region I may also be removed.

Returning to FIG. 11, after removing the hard mask layer 102, an isolation layer may be formed (S110). FIG. 10 illustrates a corresponding semiconductor structure.

As shown in FIG. 10, a top portion of the insulation layer 108 is removed; and an isolation layer 118 is formed. Further, the portion of the liner oxide layer 103 higher than the top surface of the isolation layer 118, the portion of the insulating barrier layer 106 higher than the top surface of the isolation layer 118, the portion of the first oxide layer 123 higher than the top surface of the isolation layer 118 and the portion of the second oxide layer 122 higher than the top surface of the isolation layer 118 may be removed. Thus, the top portions of the side surfaces of the first fins 111 and the top portions of the side surfaces of the second fins 122 may be exposed.

The top portions of the insulation layer 108, the liner oxide layer 103, the insulating barrier layer 106, the first oxide layer and the second oxide layer 122 may be removed by any appropriate process, such as a dry etching process, a wet etching process and a SiCoNi system etching process, etc. In one embodiment, the top portions of the insulation layer 108, the liner oxide layer 103, the insulating barrier layer 106, the first oxide layer and the second oxide layer 122 may be removed by a same etching process. In certain other embodiments, the top portions of the insulation layer 108, the liner oxide layer 103, the insulating barrier layer 106, the first oxide layer and the second oxide layer 122 may be removed by different processes.

Specifically, in one embodiment, the top portion of the insulation layer 108 is removed by a wet etching process. The etching solution may be a HF solution. The portion of the insulating barrier layer 106 higher than the top surface of the isolation layer 118 is removed by a wet etching process. The etching solution is a phosphoric acid solution. The mass percentage of the phosphoric acid solution may be in a range of approximately 65%-85%. The temperature of the etching solution may be in a range of approximately 120° C.-200° C.

Because the thickness of the first oxide layer may be smaller than the thickness of the second oxide layer 122, the feature size of the first fins 111 higher than the isolation layer 118 may be greater than the feature size of the second fins 122 higher than the isolation layer 118. Specifically, the feature size difference may be in range of approximately 3 nm-5 nm.

In one embodiment, the mask layer 102 may be removed before forming the isolation layer 118 and after forming the insulation layer 108. In certain other embodiments, the mask layer 102 may be removed after forming the isolation layer 118.

After forming the isolation layer 118, a first gate structure crossing over the first fins 111 may be formed on the surface of the isolation layer 118 in the first region I. The first gate structure may cover the top and side surfaces of the first fins 11. Further, first source/drain regions may be formed in the first fins 111 at the two sides of the first gate structure. Further, a second gate structure crossing over the second fins 122 may be formed on the surface of the isolation layer 118 in the second region II. The second gate structure may cover the top and side surfaces of the second fins 122. Further, second source/drain regions may be formed in the first second fins 122 at the two sides of the second gate structure.

Thus, a FinFET structure may be formed by the disclosed methods and processes. The corresponding FinFET structure is illustrated in FIG. 10.

As shown in FIG. 10, the FinFET structure may include a substrate 101 having a first region I and a second region II. The FinFET structure may also include a plurality of first fins 111 formed on the substrate 101 in the first region I and a plurality of second fins 112 with a feature size different from a feature size of the first fins 111 formed on the substrate 101 in the second region II. Further, the FinFET structure may also include a liner oxide layer 103 formed on the surface of the substrate 101 and the portions of the side surfaces of the first fins 111 and the second fins 122; and an insulating layer 106 formed on the liner oxide layer 103 in the first region I. Further, the FinFET structure may also include a second oxide layer 122 formed between the side surfaces of the second fins 112 and the liner oxide layer 103 in the second region II; and an isolation layer 118 with a top surface lower than the top surfaces of the first fins 111 and the second fins 112 formed on the insulating barrier layer 106 in the first region I and on the liner oxide layer 103 in the second region II. The detailed structures and intermediate structures are described above with respect to the fabrication processes.

Thus, according to the disclose processes and structures, by forming an insulation layer on the side surfaces of the first fins, the oxidation scale of the side surfaces of the first fins may be reduced during the subsequent curing annealing process. Thus, after forming the isolation layer, the feature size of the first fins may be greater than the feature size of the first fins. That is, fins with different sizes may be formed by the disclosed method.

Further, a curing annealing process may be performed on the precursor material layer, by using the oxidation scale difference between the first fins and the second fins during the curing annealing process of the precursor material layer, fins with different feature sizes may be obtained. Thus, the existing required methods forming fins may be effectively used; and the process for forming the FinFET may be simplified; and the process difficulties for forming the FinFET having fins with different sizes may be reduced. Further, comparing with the method for forming fins with a same size, only one mask may be added to form the fins with different sizes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor (FinFET), comprising:
providing a substrate having a first region, a second region, and a plurality of first fins on the first region of the substrate and a plurality of second fins on the second region of the substrate;
forming a liner oxide layer on side surfaces of the first fins, side surfaces of the second fins and a surface of the substrate;
forming an insulating barrier layer on a portion of the liner oxide layer on the first region of the substrate;
forming a precursor material layer on the insulating barrier layer on the first region of the substrate and on the liner oxide layer on the second region of the substrate;
performing a curing annealing process to convert the precursor material layer into an insulation layer, a first oxide layer being formed on the side surfaces of the first fins, and a second oxide layer being formed on the side surfaces of the second fins, wherein a thickness of the first oxide layer is smaller than a thickness of the second oxide layer after the curing annealing process; and
removing a top portion of the insulation layer to form an isolation layer and removing portions of the liner oxide layer, the insulating barrier layer, the first oxide layer and the second oxide layer higher than a surface of the isolation layer, wherein a half width at half maximum feature size of portions of the first fins higher than the surface of the isolation layer is greater than a half width at half maximum feature size of portions of the second fins higher than the surface of the isolation layer after removing portions of the liner oxide layer, the insulation layer, the first oxide layer and the second oxide layer, that are higher than the surface of the isolation layer.

2. The method according to claim 1, wherein:
a half width at half maximum feature size of the first fins is identical to a half width at half maximum feature size of the second fins before forming the liner oxide layer.

3. The method according to claim 1, wherein forming the insulating barrier layer comprises:
forming an insulating barrier film on the liner oxide layer;
forming a patterned layer on the liner oxide layer on the first region of the substrate; and
removing a portion of the insulating barrier film on the second region of the substrate by etching the insulating barrier film using the patterned layer as an etching mask.

4. The method according to claim 1, wherein:
a thickness difference between the first oxide layer and the second oxide layer is in a range of approximately 3 nm-5 nm; and
a feature size difference in half width at half maximum between portions of the first fins higher than the isolation layer and portions of the second fins higher than the isolation layer is in a range of approximately 3 nm-5 nm.

5. The method according to claim 1, wherein:
the precursor material layer is flowable; and
the precursor material layer is formed by a flowable chemical vapor deposition process.

6. The method according to claim 5, wherein:
precursors of the flowable chemical vapor deposition process include one or more of saline, disaline, methylsaline, dimethyl saline, trimethylsaline, tetramethylsaline, tetraethyl orthosilicate, (3-Aminopropyl) triethoxysilane, octamethyl cyclotetrasiloxane, 1,1,3,3-tetramethyldisiloxane, tetramethylcyclotetrasiloxane, trisilylamine, and disilylamine.

7. The method according to claim 1, wherein:
the curing annealing process is performed in a $H_2O$-containing environment.

8. The method according to claim 7, wherein the $H_2O$-containing environment further comprises:
one or more gases of $O_2$ and $O_3$.

9. The method according to claim 1, wherein:
a temperature of the curing annealing process is in a range of approximately 400° C.-500° C.

10. The method according to claim 1, after the curing annealing process, further comprising:
performing a second annealing process to the insulation layer,
wherein:

a temperature of the second annealing process is in a range of approximately 900° C.-1100° C.; and the second annealing process is performed in a N₂ environment.

11. The method according to claim 1, wherein:

the top portion of the insulation layer is removed by a wet etching process to form the isolation layer.

12. The method according to claim 1, wherein:

the liner oxide layer is formed by an in situ steam generation oxidation process.

13. The method according to claim 1, before forming the liner oxide layer, further comprising:

forming a hard mask layer on top surfaces of the first fins and top surfaces of the second fins, wherein:

the insulating barrier layer covers the hard mask layer on the first region of the substrate; and a top of the insulating barrier layer is higher than a top of the hard mask layer.

14. The method according to claim 13, before removing the top portion of the insulation layer, further comprising:

polishing the insulation layer until a top surface of the hard mask layer is exposed.

15. The method according to claim 14, further comprising:

removing the hard mask layer.

16. The method according to claim 1, wherein:

the insulating barrier layer is made of one of silicon nitride, silicon oxynitride, silicon carbide, silicon carbonitride, silicon oxycarbonitride, and boron nitride.

17. The method according to claim 1, wherein:

a thickness of the insulating barrier layer is in a range of approximately 30 Å-50 Å.

18. The method according to claim 1, wherein:

the liner oxide layer is made of silicon oxide.

* * * * *